(12) United States Patent
Pan et al.

(10) Patent No.: US 9,762,047 B2
(45) Date of Patent: Sep. 12, 2017

(54) TECHNOLOGIES FOR ZONAL FAULT PROTECTION OF DC DISTRIBUTION SYSTEMS

(71) Applicant: ABB Technology Ltd., Zurich (CH)

(72) Inventors: Jiuping Pan, Raleigh, NC (US); Li Qi, Cary, NC (US); Xianyong Feng, Cary, NC (US)

(*) Notice: Subject to any disclaimer, the term of this patent is extended or adjusted under 35 U.S.C. 154(b) by 108 days.

(21) Appl. No.: 14/741,412

(22) Filed: Jun. 16, 2015

(65) Prior Publication Data

US 2016/0372911 A1    Dec. 22, 2016

(51) Int. Cl.
| | |
|---|---|
| H02H 3/00 | (2006.01) |
| H02H 3/08 | (2006.01) |
| H02H 7/26 | (2006.01) |
| H02H 3/04 | (2006.01) |
| H02H 3/20 | (2006.01) |
| G01R 31/08 | (2006.01) |

(52) U.S. Cl.
CPC .............. *H02H 3/08* (2013.01); *H02H 3/042* (2013.01); *H02H 7/261* (2013.01); *H02H 7/262* (2013.01); *H02H 7/268* (2013.01); *G01R 31/08* (2013.01); *H02H 3/20* (2013.01)

(58) Field of Classification Search
USPC ...................................................... 361/62–69
See application file for complete search history.

(56) References Cited

U.S. PATENT DOCUMENTS

| | | | |
|---|---|---|---|
| 4,835,652 A | 5/1989 | Billings et al. | |
| 5,363,047 A | 11/1994 | Dresti et al. | |
| 5,523,938 A | 6/1996 | Wagner et al. | |
| 7,489,138 B2 | 2/2009 | Yu et al. | |
| 7,626,791 B2 | 12/2009 | Newman et al. | |
| 7,834,637 B2 | 11/2010 | Kojori et al. | |

(Continued)

FOREIGN PATENT DOCUMENTS

| | | |
|---|---|---|
| CN | 102306956 A | 1/2012 |
| CN | 103001191 A1 | 3/2013 |

(Continued)

OTHER PUBLICATIONS

Extended European Search Report, European Application No. 16171229.4-1806, dated Oct. 13, 2016, 7 pages.

(Continued)

*Primary Examiner* — Danny Nguyen
(74) *Attorney, Agent, or Firm* — Barnes & Thornburg LLP

(57) ABSTRACT

Technologies for detecting a fault location in a DC electrical distribution system include a bus protection unit that monitors a DC electrical bus. The bus protection unit includes at least one sensor to produce sensor data indicative of one or more characteristics of the DC electrical bus monitored by the bus protection unit. The bus protection unit monitors the sensor data, determines whether a fault has occurred based on the sensor data, and determines whether the fault occurred within a bus zone defined by the DC electrical bus in response to determining that the fault has occurred. Further, the bus detection unit trips isolation devices within the bus zone in response to a determination that the fault occurred within the bus zone or a communication from another bus protection unit indicating the fault has occurred within the bus zone. The bus protection unit transmits a bus fault indication signal to another bus protection unit in response to a determination that the fault has occurred.

20 Claims, 8 Drawing Sheets

(56) References Cited

U.S. PATENT DOCUMENTS

| | | | |
|---|---|---|---|
| 7,969,696 | B2 | 6/2011 | Lazarovich et al. |
| 8,049,358 | B2 | 11/2011 | Crane et al. |
| 8,067,942 | B2 | 11/2011 | Pan et al. |
| 8,085,517 | B2 | 12/2011 | Weems, II et al. |
| 8,405,945 | B2 | 3/2013 | DiMarco et al. |
| 8,494,830 | B2 | 7/2013 | Radibratovic et al. |
| 2004/0027749 | A1 | 2/2004 | Zuercher et al. |
| 2010/0208393 | A1* | 8/2010 | Vedula ............... H02H 7/26 361/18 |
| 2011/0299201 | A1 | 12/2011 | Rozman et al. |
| 2012/0182657 | A1 | 7/2012 | Narendra et al. |
| 2012/0200966 | A1 | 8/2012 | Hill et al. |
| 2013/0271884 | A1 | 10/2013 | Wagner et al. |
| 2013/0286521 | A1* | 10/2013 | Park ................. H02H 3/066 361/57 |
| 2013/0325366 | A1 | 12/2013 | Rozman et al. |
| 2013/0329329 | A1 | 12/2013 | Liu et al. |
| 2014/0078628 | A1 | 3/2014 | Valdes et al. |
| 2015/0270704 | A1 | 9/2015 | Qi et al. |
| 2015/0288167 | A1* | 10/2015 | Stepanek ............ H02H 3/16 361/42 |

FOREIGN PATENT DOCUMENTS

| | | |
|---|---|---|
| CN | 103207350 A | 7/2013 |
| CN | 103457246 A | 12/2013 |
| DE | 10131226 A1 | 1/2003 |
| EP | 1914162 A1 | 4/2006 |
| EP | 2654156 A1 | 10/2013 |
| JP | 2004061448 A | 2/2004 |
| JP | 2008029044 A | 2/2008 |
| JP | 25010022134 A | 1/2010 |
| WO | 2011012174 A1 | 2/2011 |
| WO | 2011157305 A1 | 12/2011 |
| WO | 2012123014 A2 | 9/2012 |
| WO | 2012143245 A1 | 10/2012 |
| WO | 2013174726 A1 | 11/2013 |
| WO | 2015168830 A9 | 11/2015 |

OTHER PUBLICATIONS

International Search Report and Written Opinion for Application No. PCT/CN2014/076720, dated Jan. 6, 2015.

* cited by examiner

TECHNOLOGIES FOR ZONAL FAULT PROTECTION OF DC DISTRIBUTION SYSTEMS

BACKGROUND

Direct current (DC) electrical distribution systems are used for various applications such as, for example, aircraft power supply systems, electric ships, renewable energy collection grids, micro-grids, data center power supply systems, and other applications. DC distribution systems are often utilized to improve system efficiency and/or provide space and weight savings associated with the physical equipment used.

For DC distribution systems, it is often very challenging to achieve fast and reliable fault detection and location determination due to various factors such as, for example, a small circuit impedance and impacts of fault current limiting functions of converters. Differential protection, current direction, impedance protection, transient energy, and/or overcurrent methods may be used in various embodiments for short circuit protection in DC distribution systems. However, each of those methods has corresponding application features and functionality limitations. For example, differential protection and impedance protection methods may be suitable for DC distribution systems but may not be able to achieve speed and performance requirements.

SUMMARY

According to one aspect, a bus protection unit for detecting a fault location in a direct current (DC) electrical distribution system may include at least one sensor to produce sensor data indicative of one or more characteristics of a DC electrical bus monitored by the bus protection unit, a fault detection module to monitor the sensor data, determine whether a fault has occurred based on the produced sensor data, and determine whether the fault occurred within a bus zone defined by the DC electrical bus in response to a determination that the fault has occurred, a fault isolation module to trip isolation devices within the bus zone in response to a determination that the fault occurred within the bus zone or a communication from another bus protection unit that indicates the fault has occurred within the bus zone, and a communication module to transmit a fault indication signal to a neighboring bus protection unit in response to a determination that the fault has occurred.

In some embodiments, monitoring the sensor data may include monitoring a bus voltage of the DC electrical bus and/or a current of the DC electrical bus. Determining whether the fault occurred may include applying a fault detection algorithm to the produced sensor data. The isolation device may include an electrical switch. In some embodiments, the communication module is further to transmit the fault indication signal to each other bus protection unit communicatively coupled to the bus protection unit. Transmitting the fault indication signal to the neighboring bus protection unit may include transmitting a digital signal to the neighboring bus protection unit.

In some embodiments, the bus protection unit may also include a fault timer module to establish a trip timer in response to transmittal of the fault indication signal to the neighboring bus protection unit and trip the isolation device in response to a determination that the trip timer has exceeded a predetermined threshold. The bus protection unit may comprise a distribution bus protection unit that monitors a DC distribution bus electrically coupled to a main bus and a load bus. The distribution bus protection unit may be communicatively coupled to a main bus protection unit that monitors the main bus and a load bus protection unit that monitors the load bus. In some embodiments, the bus protection unit may comprise a load bus protection unit that monitors a DC load bus electrically coupled to a distribution bus. The bus protection unit may comprise a main bus protection unit that monitors a DC main bus electrically coupled to a utility power system and a distribution bus. In some embodiments, the bus protection unit includes a microcontroller.

According to another aspect, a method for detecting a location of a fault in a direct current (DC) electrical distribution system may include monitoring, by a bus protection unit, sensor data produced by at least one sensor of the bus protection unit, determining, by the bus protection unit, whether a fault has occurred based on the produced sensor data and whether the fault occurred within a bus zone defined by the DC electrical bus in response to determining the fault has occurred, tripping, by the bus protection unit, isolation devices within the bus zone in response to determining the fault occurred within the bus zone or receiving a communication from another bus protection unit indicating that the fault has occurred within the bus zone, and transmitting, by the bus protection unit, a bus fault indication signal to a neighboring bus protection unit in response to determining the fault has occurred. The sensor data may be indicative of one or more characteristics of a DC electrical bus monitored by the bus protection unit.

In some embodiments, monitoring the sensor data may include monitoring at least one of a bus voltage or a current of the DC electrical bus. The method may further include transmitting, by the bus protection unit, the fault indication signal to each other bus protection unit communicatively coupled to the bus protection unit. In some embodiments, the method includes establishing, by the bus protection unit, a trip timer in response to transmitting the fault indication signal to the neighboring bus protection unit, and tripping, by the bus protection unit, the isolation device in response to determining that the trip timer has exceeded a predetermined threshold.

According to yet another aspect, one or more machine-readable storage media comprising a plurality of instructions stored thereon that, in response to execution by a bus protection unit, may cause the bus protection unit to monitor sensor data produced by at least one sensor of the bus protection unit, determine whether a fault has occurred based on the produced sensor data, determine whether the fault occurred within a bus zone defined by the DC electrical bus in response to a determination that the fault has occurred, trip isolation devices within the bus zone in response to a determination that the fault occurred within the bus zone or a communication from another bus protection unit that indicates the fault has occurred within the bus zone, and transmit a bus fault indication signal to a neighboring bus protection unit in response to a determination that the fault has occurred. The sensor data may be indicative of one or more characteristics of a DC electrical bus monitored by the bus protection unit.

In some embodiments, monitoring the sensor data may include monitoring at least one of a bus voltage or a current of the DC electrical bus. Transmitting the fault indication signal to the neighboring bus protection unit may include transmitting a digital signal to the neighboring bus protection unit.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
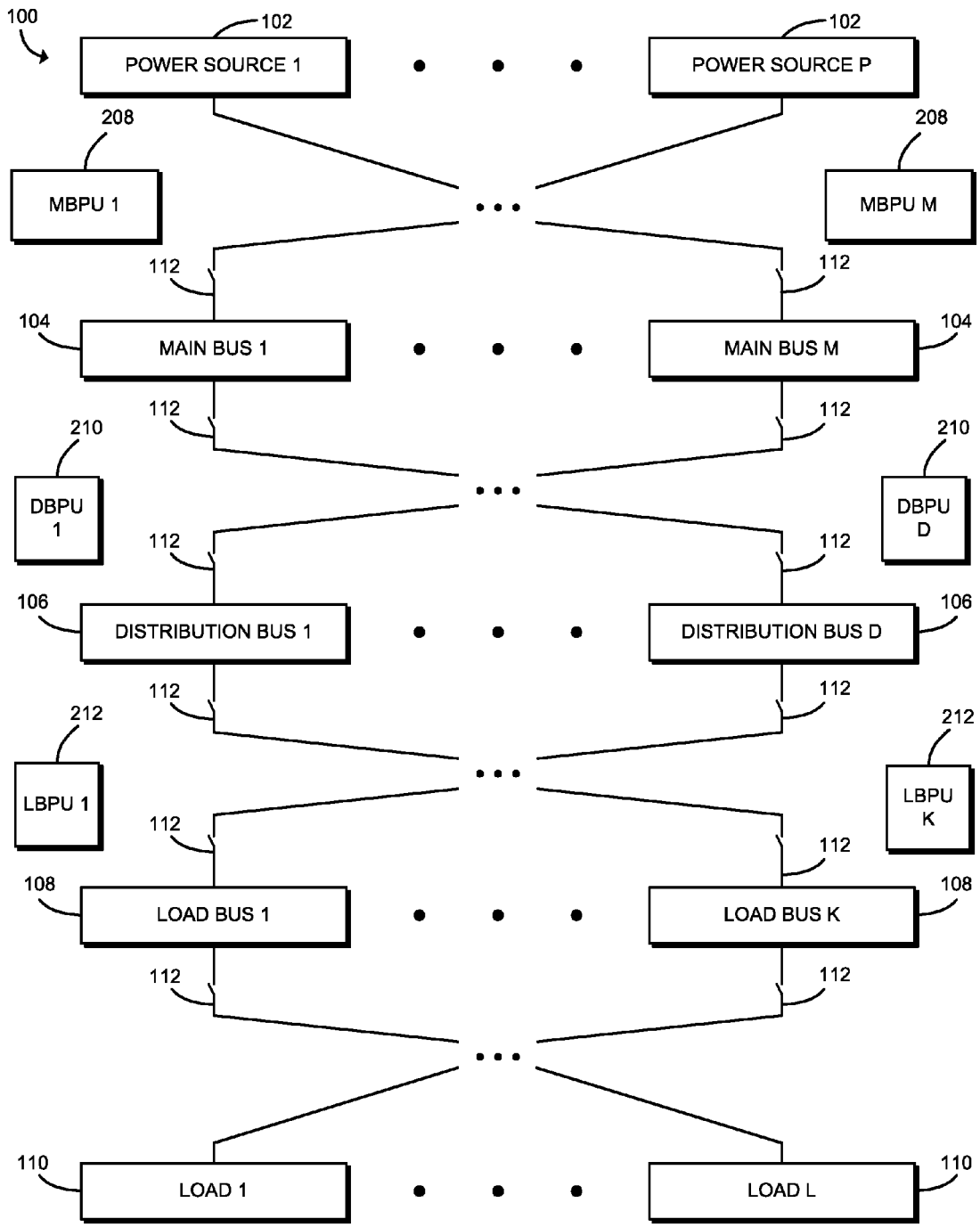
FIG. 1 is a simplified block diagram of at least one embodiment of a DC distribution system for zonal fault protection.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C): (A and B); (B and C); (A and C); or (A, B, and C). Similarly, items listed in the form of "at least one of A, B, or C" can mean (A); (B); (C): (A and B); (B and C); (A and C); or (A, B, and C).

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

As described in detail below, DC power is distributed to various loads of a DC distribution system by virtue of various levels or layers of buses (e.g., main buses, distribution buses, and load buses). In some embodiments, each of the buses may include a separate bus protection unit (see, for example, FIGS. 2-3) that is configured to analyze sensor data (e.g., bus voltage and circuit current values) associated with that bus to determine whether a fault condition has occurred. If a particular bus protection unit determines that a fault has occurred within a bus zone defined by the corresponding bus, the bus protection unit may trip associated isolation devices to isolate the fault; however, if the bus protection unit determines that a fault has occurred outside the bus zone, the bus protection unit may transmit a fault indication signal (e.g., a DC signal) to neighboring bus protection units (e.g., upstream and/or downstream). In the illustrative embodiment, with such peer-to-peer communication between neighboring bus protection units, a fault on the distribution circuit between DC electrical buses can be detected by the corresponding bus protection units.

Referring now to FIG. 1, a DC distribution system 100 that utilizes zonal fault protection is shown. The illustrative DC distribution system 100 includes one or more power sources 102, one or more main buses 104, one or more distribution buses 106, one or more load buses 108, one or more loads 110, one or more main bus protection units (MBPUs) 208, one or more distribution bus protection units (DBPUs) 210, and one or more load bus protection units (LBPUs) 212. It should be appreciated that the DC distribution system 100 may be structured with multiple power distribution levels. For example, the illustrative DC distribution system 100 includes a main bus level, a first distribution bus level, a second distribution bus level, and a load bus level electrically coupled between the power sources 102 and the loads 110.

Each of the power sources 102 may be embodied as any device, component, or collection thereof, configured to generate power for the DC distribution system 100. It should be appreciated that each of the power sources 102 may be configured to generate alternating current (AC) power or direct current (DC) power depending on the particular embodiment. For example, the power sources 102 may include a utility power grid, a local power generator (e.g., a photovoltaic power cell), and/or other power sources. In embodiments in which AC power is generated, the DC distribution system 100 may include power converters (e.g., rectifiers) and/or power conditioning devices to convert the AC power into an appropriate DC power. Similarly, the DC distribution system 100 may include DC-DC converters (e.g., step up/down converters) to interface two DC distribution sub-systems with different voltage levels (e.g., to convert a DC voltage to a common DC voltage). In some embodiments, one or more of such converters may form a portion of the corresponding power source 102.

Each of the main buses 104, the distribution buses 106, and/or the load buses 108 may be embodied as any suitable power distribution bus capable of performing the functions described herein. In the illustrative embodiment, each of the main buses 104 is electrically coupled to one or more of the power sources 102, and each of the load buses 108 is electrically coupled to one or more of the loads 110. Further, each of the main buses 104 is electrically coupled to one or more of the distribution buses 106, and each of the distribution buses 106 is electrically coupled to one or more of the load buses 108. It will further be appreciated that the circuits between the main buses 104 and the distribution buses 106 establish primary power distribution circuits (not labeled for clarity of the FIGS. 1-3), and the circuits between the distribution buses 106 and the load buses 108 establishes secondary power distribution circuits (not labeled for clarity of the FIGS. 1-3). Each of the loads 110 (some of which are only identified by "L" in FIGS. 2-3 without a corresponding reference number 110 for clarity of the figure) may be embodied as any device, component, or combination thereof capable of receiving power from the DC distribution system 100 or, more particularly, from one or more of the load buses 108. Of course, in some embodiments, the DC distribution system 100 may include a DC-AC converter between a load bus 108 and an AC load 110 such that the DC distribution system 100 may also be utilized to power AC loads 110.

Figure 2:
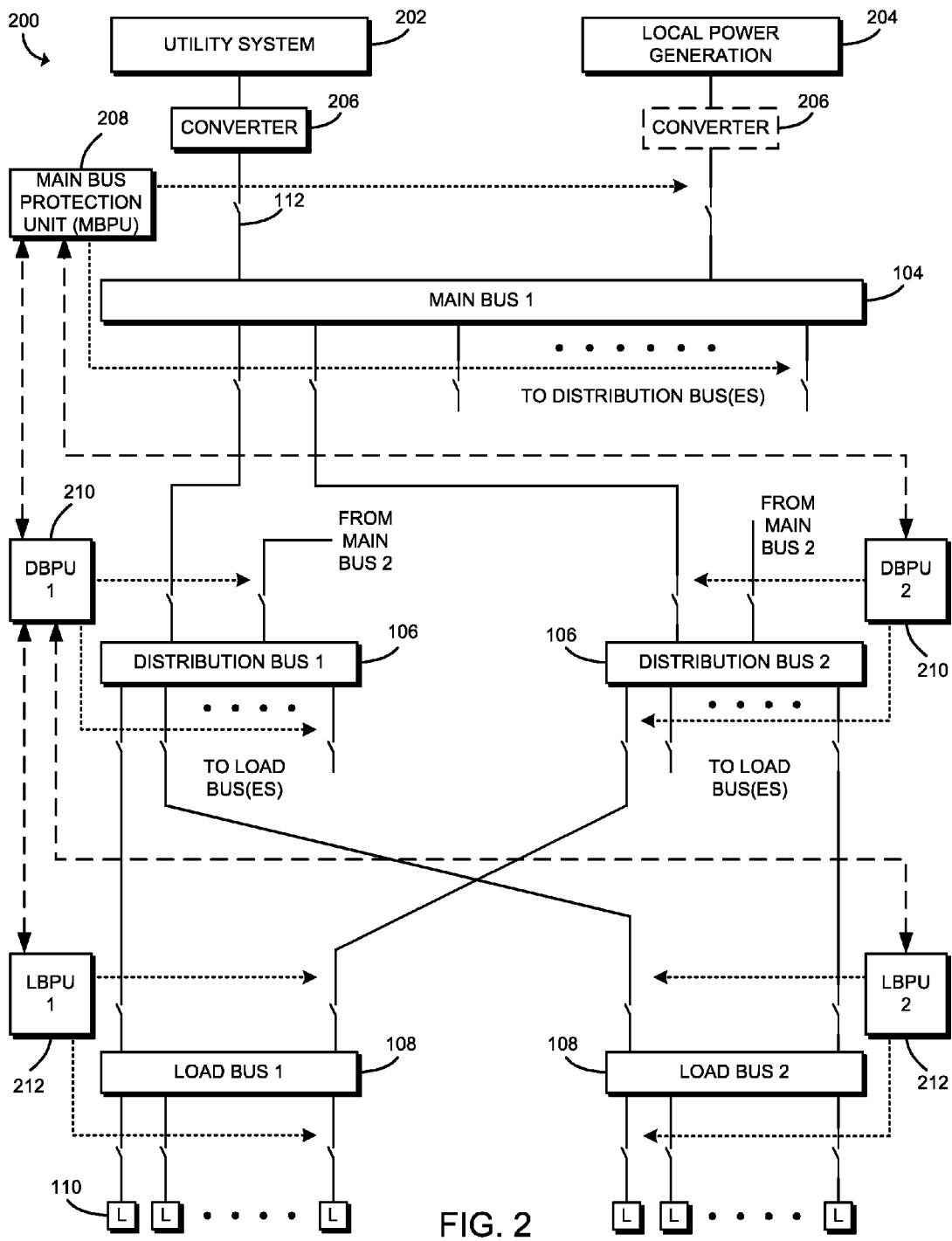
FIG. 2 is a simplified block diagram of at least one embodiment of the DC distribution system of FIG. 1.
Figure 3:
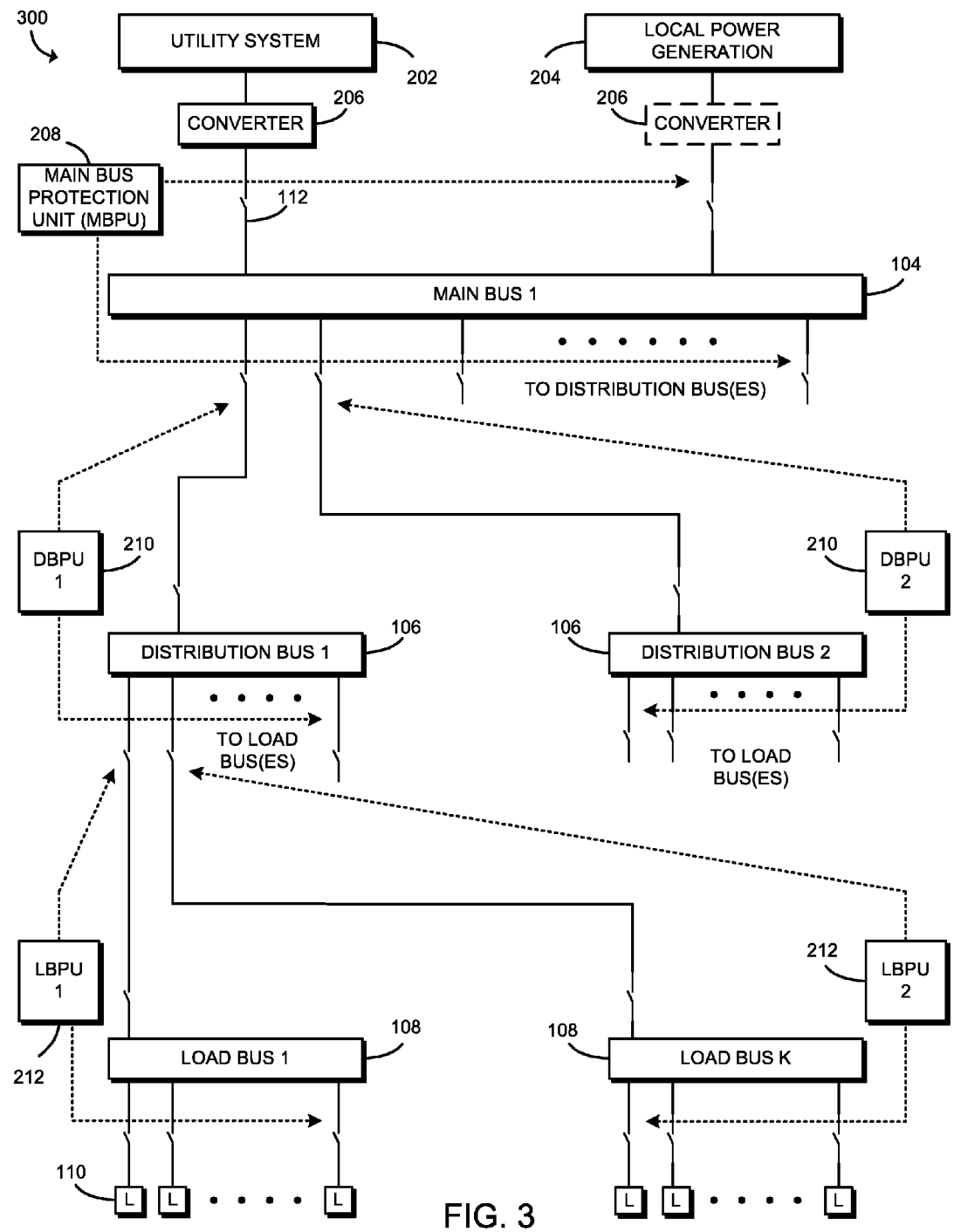
FIG. 3 is a simplified block diagram of at least one other embodiment of the DC distribution system of FIG. 1.

As shown in FIG. 1, the DC distribution system 100 includes isolation devices 112 (some of which are only identified by electrical switch symbols in FIGS. 1-3 without a corresponding reference number 112 for clarity of the figures) between each level of the DC distribution system 100. For example, the primary power distribution circuits and the secondary power distribution circuits include isolation devices 112. Each of the isolation devices 112 may be embodied as any device, component, or combination thereof that are capable of "breaking" a circuit (e.g., causing an open circuit) to isolate two portions of the corresponding circuit from one another. For example, in some embodiments, the isolation devices 112 may be embodied as electrical switches or breakers. Further, in some embodiments, energy storage, converters (e.g., DC-DC converters), and/or other distributed resources may be electrically coupled to a main bus 104, distribution bus 106, and/or load bus 108.

It should be appreciated that the DC distribution system 100 may include any number (p) of power sources 102, any number (m) of main buses 104, any number (d) of distribution buses 106, any number (k) of load buses 108, and any number (l) of loads 110. Further, each of the numbers (p, m, d, k, l) may be the same or different depending on the particular embodiment. For example, in an embodiment, the DC distribution system 100 may include one power source 102, one main bus 104, two distribution buses 106, two load buses 108, and ten loads 110. The buses 104, 106, 106 may be separated from one another by various distances depending on the particular embodiment (e.g., fewer than ten meters, tens of meters, hundreds of meters, thousands of meters, etc.). Further, although the loads 110 are shown as being electrically coupled to the load buses 108, in some embodiments, one or more of the loads 110 may be electrically coupled directly to the distribution bus(es) 106 and/or the main bus(es) 104. As shown in FIG. 1, each of the buses 104, 106, 108 may include a bus protection unit that analyzes sensor data associated with the corresponding bus to determine whether a fault has occurred (see, for example, FIGS. 2-3). For example, a main bus protection unit 208 may monitor a main bus 104, a distribution bus protection unit 210 may monitor a distribution bus 106, and a load bus protection unit 212 may monitor a load bus 108. The bus protection unit handles the faults within the bus zone and/or transmits a fault indication signal to the neighboring bus protection unit(s) (i.e., the bus protection units associated with the adjacent buses—upstream or downstream) of the DC distribution system 100.

Referring now to FIG. 2, at least one embodiment of the DC distribution system 100 is shown (hereinafter referred to as "DC distribution system 200"). As described herein, fast and selective fault protection is a significant challenge for DC distribution systems. For example, when a short circuit fault occurs in a DC distribution system, fault currents are typically contributed to by all sources and distributed shunt capacitive devices. Because fault currents are generally not sensitive to fault locations in compact and meshed DC distribution systems (e.g., due to small circuit impedance), it is often difficult to selectively determine an appropriate switching action to isolate the fault directly based on local measurements (e.g., of voltage and/or current). Fast energy exchange between capacitive and inductive elements and the fault current limiting functions of converters make fault isolation based on local measurements even more challenging. For example, in DC distribution systems, it is often difficult to identify a precise location of the circuit between a main bus 104 and a particular load 110 at which a fault actually occurred based on local measurements.

As shown in FIG. 2, the illustrative DC distribution system 200 includes two main buses 104 (the second main bus 104 not explicitly shown), two distribution buses 106, two load buses 108, and a plurality of loads 110. Of course, the DC distribution system 200 may include additional or other power distribution levels in other embodiments as discussed above. In the illustrative embodiment, the first main bus 104 is electrically coupled to the first distribution bus 106 and the second distribution bus 106. Additionally, the second main bus 104 is electrically coupled to each of the first and second distribution buses 106. Similarly, each of the distribution buses 106 of the illustrative DC distribution system 200 is electrically coupled to each of the load buses 108. It will be appreciated that the DC distribution system 200 includes isolation devices 112 dispersed at each electrical link extending from the corresponding bus 104, 106, 108. As such, isolation devices 112 are located at both ends of the primary and secondary distribution circuits.

The illustrative DC distribution system 200 includes a utility system 202 and a local power generator 204 that serve as the power sources 102 of the first main bus 104. The second main bus 104 may be similarly powered or powered by different power sources 102 depending on the particular embodiment. As shown, the DC distribution system 200 may include an converter 206 (e.g., a rectifier) coupled between the utility system 202 and the first main bus 104 to convert AC power supplied by the utility system 202 into DC power that is supplied to the first main bus 104. Of course, if the local power generator 204 is configured to output AC power, the DC distribution system 200 may also utilize a converter 206 (e.g., a rectifier) to convert the AC power accordingly. In other embodiments, the DC distribution system 200 may include a DC-DC converter (e.g., a buck or boost converter) in order to convert a DC power supplied by the local power generator 204 into a more suitable/usable DC power signal to be supplied to the main bus 104.

As shown and described herein, the DC distribution system 200 includes a separate bus protection unit for each of the buses 104, 106, 108. In particular, the DC distribution system 200 includes a main bus protection unit (MBPU) 208, a first and second distribution bus protection unit (DPBU) 210, and a first and second load bus protection unit (LBPU) 212. Each of the bus protection units 208, 210, 212 includes local sensors and/or is coupled to local sensors of the corresponding bus 104, 106, 108. Accordingly, in some embodiments, the bus protection units 208, 210, 212 may obtain bus voltage and circuit current values, which may be analyzed to determine whether a fault has occurred. Further, in some embodiments, the bus protection units 208, 210, 212 are coupled to the corresponding isolation devices 112 (e.g., local circuit switches) and configured to control the operation of those isolation devices 112 (e.g., by "opening" and "closing" the isolation devices 112) as shown in FIG. 2.

It should be appreciated that the bus protection units 208, 210, 212 establish zonal fault protection for the DC distribution system 200. For example, each main bus protection unit 208 may establish a main bus protection zone defined by the corresponding main bus 104, each distribution bus protection unit 210 may establish a distribution bus protection zone defined by the corresponding distribution bus 106, and/or each load bus protection unit 212 may establish a load bus protection zone defined by the corresponding load bus 108. Further, the bus protection units 208, 210, 212 may establish distribution circuit protection zones in some embodiments. For example, a primary distribution circuit zone may be protected by the corresponding main bus protection unit(s) 208 and the corresponding distribution bus protection unit(s) 210. Similarly, a secondary distribution circuit zone may be protected by the corresponding distribution bus protection unit(s) 210 and the corresponding load bus protection unit(s) 212.

In the illustrative embodiment, each of the first and second distribution bus protection units 210 is communicatively coupled (e.g., via two-way communication) to the main bus protection unit 208 as shown. It will be appreciated that the distribution protection units 210 may be referred to herein as "neighbors" of the main bus protection unit 208 or "neighboring" the main bus protection unit 208 and vice-versa. As such, a bus protection unit is considered to "neighbor" another bus protection unit if both of the bus protection units are configured to monitor a common bus or common set of isolation devices 112 and/or the bus protection units are configured to communicate with one another. Similarly, the load bus protection units 212 are communicatively coupled to the first distribution bus protection unit 210. In some embodiments, one or more of the load bus protection units 212 may additionally, or alternatively, be communicatively coupled to a second main bus protection unit 208 (e.g., embodiments in which the DC distribution system 200 includes a second main bus 104, which is not shown for clarity of the figures). In other words, the bus protection units 208, 210 and the bus protection units 210, 212 may communicate with one another over the corresponding communicative links as described herein. As such, fault indication signals may be transmitted from a bus protection unit 208, 210, 212 to one or more of its neighboring bus protection units 208, 210, 212.

Referring now to FIG. 3, at least one other embodiment of the DC distribution system 100 is shown (hereinafter referred to as "DC distribution system 300"). It will be appreciated that the DC distribution system 300 may include the similar components as the DC distribution system 200 described above in reference to FIG. 2. However, unlike the DC distribution system 200 of FIG. 2, the DC distribution system 300 of FIG. 3 establishes zonal protection without the use of separate communicative links between the bus protection units 208, 210, 212. As such, in some embodiments, the DC distribution system 300 may be effectively utilized for a compact DC data center. For example, in some embodiments, the load bus protection zone, including the connected secondary distribution circuit(s) described above, may be protected by the corresponding load bus protection unit 212. The distribution bus zone, including the connected primary distribution circuit(s) described above, may be protected by the distribution bus protection unit 210. The main bus protection zone defined by the main bus 104 may be protected by the main bus protection unit 208.

Figure 4:
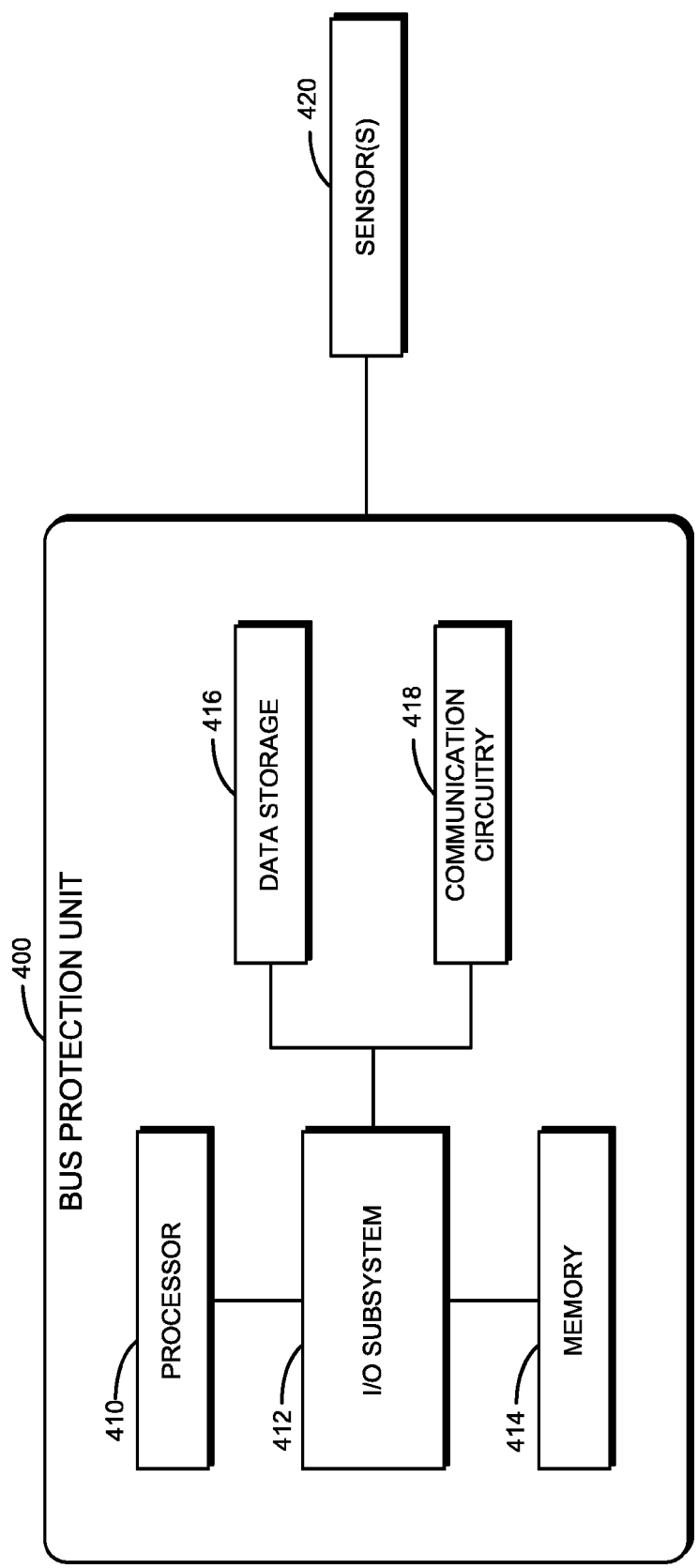
FIG. 4 is a simplified block diagram of at least one embodiment of a bus protection unit of FIGS. 2-3.

Referring now to FIG. 4, at least one embodiment of a bus protection unit 400 is shown. It should be appreciated that each of the main bus protection units 208, the distribution bus protection units 210, and/or the load bus protection units 212 may be similar to the bus protection unit 400 described herein. Of course, in some embodiments, particular bus protection unit 208, 210, 212 may include additional, or alternative, components and modules to those described herein. Further, in some embodiments, one or more of the components and/or modules of the bus protection unit 400 may be omitted from a particular bus protection unit 208, 210, 212.

The bus protection unit 400 may be embodied as any type of computing device/component capable of performing the functions described herein. For example, in the illustrative embodiment, the bus protection unit 400 is embodied as a microcontroller. However, in other embodiments, the bus protection unit 400 may be embodied, for example, as a desktop computer, laptop computer, server, router, switch, Hybrid device, Internet of Things (IoT) device, and/or any other suitable computing/communication device. As shown in FIG. 4, the illustrative bus protection unit 400 includes a processor 410, an input/output ("I/O") subsystem 412, a memory 414, a data storage 416, and a communication circuitry 418. Additionally, as shown, the bus protection unit 400 may include and/or be electrically or communicatively coupled to one or more sensors 420. Depending on the particular embodiment, the sensor(s) 420 may be incorporate into the bus protection unit 400 or located outside of the bus protection unit 400 and coupled to the bus protection unit 400. Of course, the bus protection unit 400 may include other or additional components, such as those commonly found in a typical computing device or controller (e.g., various input/output devices and/or other components), in other embodiments. Additionally, in some embodiments, one or more of the illustrative components may be incorporated in, or otherwise form a portion of, another component. For example, the memory 414, or portions thereof, may be incorporated in the processor 410 in some embodiments.

The processor 410 may be embodied as any type of processor capable of performing the functions described herein. For example, the processor 410 may be embodied as a single or multi-core processor(s), digital signal processor, microcontroller, or other processor or processing/controlling circuit. Similarly, the memory 414 may be embodied as any type of volatile or non-volatile memory or data storage capable of performing the functions described herein. In operation, the memory 414 may store various data and software used during operation of the bus protection unit 400 such as operating systems, applications, programs, libraries, and drivers. The memory 414 is communicatively coupled to the processor 410 via the I/O subsystem 412, which may be embodied as circuitry and/or components to facilitate input/output operations with the processor 410, the memory 414, and other components of the bus protection unit 400. For example, the I/O subsystem 412 may be embodied as, or otherwise include, memory controller hubs, input/output control hubs, firmware devices, communication links (i.e., point-to-point links, bus links, wires, cables, light guides, printed circuit board traces, etc.) and/or other components and subsystems to facilitate the input/output operations.

The data storage 416 may be embodied as any type of device or devices configured for short-term or long-term storage of data such as, for example, memory devices and circuits, memory cards, hard disk drives, solid-state drives, or other data storage devices. The data storage 416 and/or the memory 414 may store various data during operation of the bus protection unit 400 as described herein.

The communication circuitry 418 may be embodied as any communication circuit, device, or collection thereof, capable of enabling communications between the bus protection unit 400 and other remote devices. For example, as described herein, a particular bus protection unit 208, 210, 212 may communicate with neighboring bus protection unit(s) 208, 210, 212 to transmit/receive fault indication signals and/or other information that is useful in ascertaining the true location of a fault in the DC distribution system 100. In the illustrative embodiment, the bus protection units 208, 210, 212 communicate using basic signal transmissions (e.g., digital signals). However, it should be appreciated that the communication circuitry 418 may be configured to use any one or more communication technologies (e.g., wireless or wired communications) and associated protocols (e.g., Ethernet, Bluetooth®, WiFi®, WiMAX, etc.) to effect such communication.

The sensors 420 generate, produce, or output sensor data based on a measured signal indicative of the environment (e.g., hardware, firmware, and/or software environment) and/or context of the monitored bus. For example, as described below, the sensors 420 may produce sensor data that may be utilized by the bus protection unit 400 to determine whether an electric fault has occurred (e.g., by monitoring voltage, current, temperature, etc.). In various embodiments, the sensors 420 may be embodied as, or otherwise include, for example, voltage sensors, current sensors, impedance sensors, capacitance sensors, temperature sensors, image sensors, communication sensors, piezoelectric sensors, optical sensors, light sensors, audio sensors, inertial sensors, proximity sensors, motion sensors, pressure sensors, software sensors, and/or other types of sensors that generate data useful to the bus protection unit 400, which may vary depending on the particular bus protection unit 400. In some embodiments, one or more of the sensors 420 may be embodied as a communication circuit configured to receive external sensor data and information. For example, as described below, in some embodiments, the sensors 420 and/or another circuit may be configured to receive fault indication signals (e.g., indicating a fault or confirmation of fault isolation) from upstream and/or downstream bus protection units.

Of course, the bus protection unit 400 may also include components and/or devices configured to facilitate the use of the sensor 420. Further, in some embodiments, the sensors 420 may be embodied elsewhere in the DC distribution system 100 and configured to transmit the generated sensor data to the bus protection unit 400 for analysis.

Figure 5:
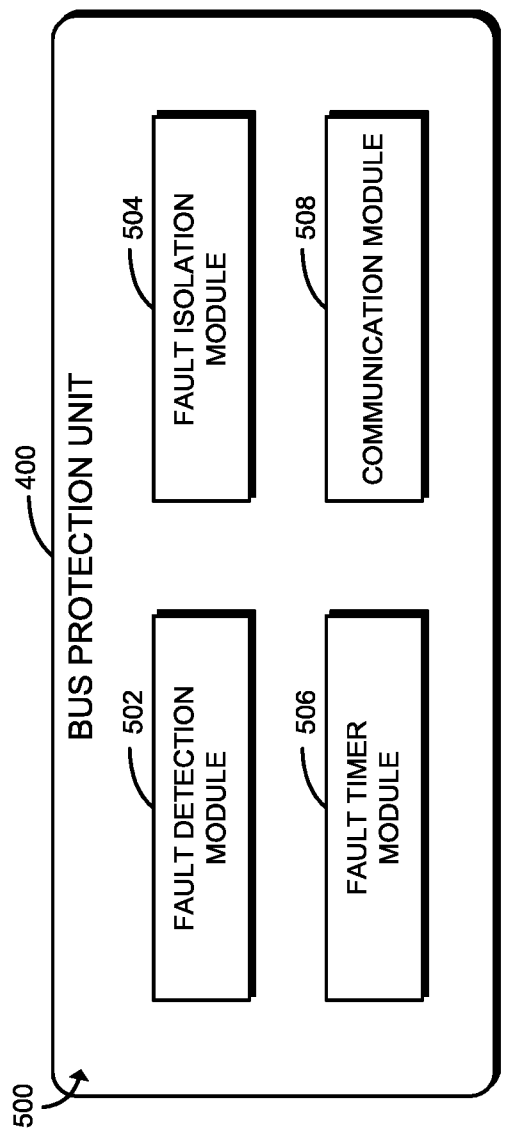
FIG. 5 is a simplified block diagram of at least one embodiment of an environment of the bus protection unit of FIG. 4.

Referring now to FIG. 5, in use, the bus protection unit 400 establishes an environment 500 for zonal fault protection of the DC distribution system 100. The illustrative environment 500 of the bus protection unit 400 includes a fault detection module 502, a fault isolation module 504, a fault timer module 506, and a communication module 508. The various modules of the environment 500 may be embodied as hardware, software, firmware, or a combination thereof. For example, the various modules, logic, and other components of the environment 500 may form a portion of, or otherwise be established by, the processor 410 or other hardware components of the bus protection unit 400. As such, in some embodiments, one or more of the modules of the environment 500 may be embodied as a circuit or collection of electrical devices (e.g., a fault detection circuit, a fault isolation circuit, a fault timer circuit, and/or a communication circuit). Additionally, in some embodiments, one or more of the illustrative modules may form a portion of another module.

The fault detection module 502 is configured to monitor and analyze sensor data generated by the sensors 420 (e.g., voltage data, current data, etc.) to determine, for example, whether an electrical fault has occurred. If a fault has occurred, the fault detection module 502 may further determine an approximate location at which the fault occurred. For example, the fault detection module 502 may determine whether the fault occurred within the bus zone defined by the bus protected by the bus protection unit 400. It will be appreciated that the fault detection module 502 may utilize any suitable fault detection algorithms for making such determinations. In some embodiments, the fault detection module 502 may use fault detection algorithms to analyze fault signatures such as voltage magnitudes, voltage derivatives, current directions, current magnitudes, current derivatives, current differentials, fault impedance, transient power, and/or other suitable parameters. For example, in some embodiments, the fault detection module 502 may consider a bus voltage decrease or current increase to be indicative of a fault in the DC distribution system 100 if the increase/decrease exceeds a predefined threshold. Further, depending on the particular embodiment, the fault detection module 502 may monitor the sensor data continuously, periodically, or based on other criteria (e.g., in response to the satisfaction of some condition).

The fault isolation module 504 is configured to trip one or more isolation devices 112 within the bus zone protected by the bus protection unit 400. It should be appreciated that the fault isolation module 504 may use any suitable technique and/or mechanism for tripping the appropriate isolation devices 112. In some embodiments, the fault detection module 502 determines the appropriate isolation devices 112 to trip (e.g., "open" a switch) based on the generated sensor data and instructs the fault isolation module 504 of the isolation devices 112 to trip. In other embodiments, the fault isolation module 504 makes such determinations. As described above, by tripping the isolation devices 112, the fault isolation module 504 may isolate a portion of the DC distribution system 100 from the remainder of the DC distribution system 100.

The fault timer module 506 may establish a trip timer that may be used as backup protection to initiate a trip of the isolation devices 112. As described below, the fault timer module 506 may establish and increment the trip timer in response to sending a fault indication signal to a neighboring bus protection unit (e.g., if the fault is not within the bus zone of the bus protection unit 400). If the trip timer exceeds a predetermined threshold before the bus protection unit 400 receives a fault indication signal from the neighboring bus protection unit (e.g., indicating that the fault has been identified as occurring on the distribution circuit between the two buses), the bus protection unit 400 may trip the appropriate isolation devices 112 to disconnect the faulted circuit.

The communication module 508 handles the communication between the bus protection unit 400 and other devices/components of the DC distribution system 100. For example, as described herein, the bus protection unit 400 may transmit a fault indication signal to other neighboring buses and/or neighboring bus protection units to indicate that a fault has been detected and/or identified. It should be appreciated that, in some embodiments, the communication module 508 may handle very simple communication between the bus protection units 208, 210, 212 (e.g., a DC signal transmission), whereas in other embodiments, the communication module 508 may utilize more sophisticated communication protocols to communicate with other bus protection units.

Figure 6:
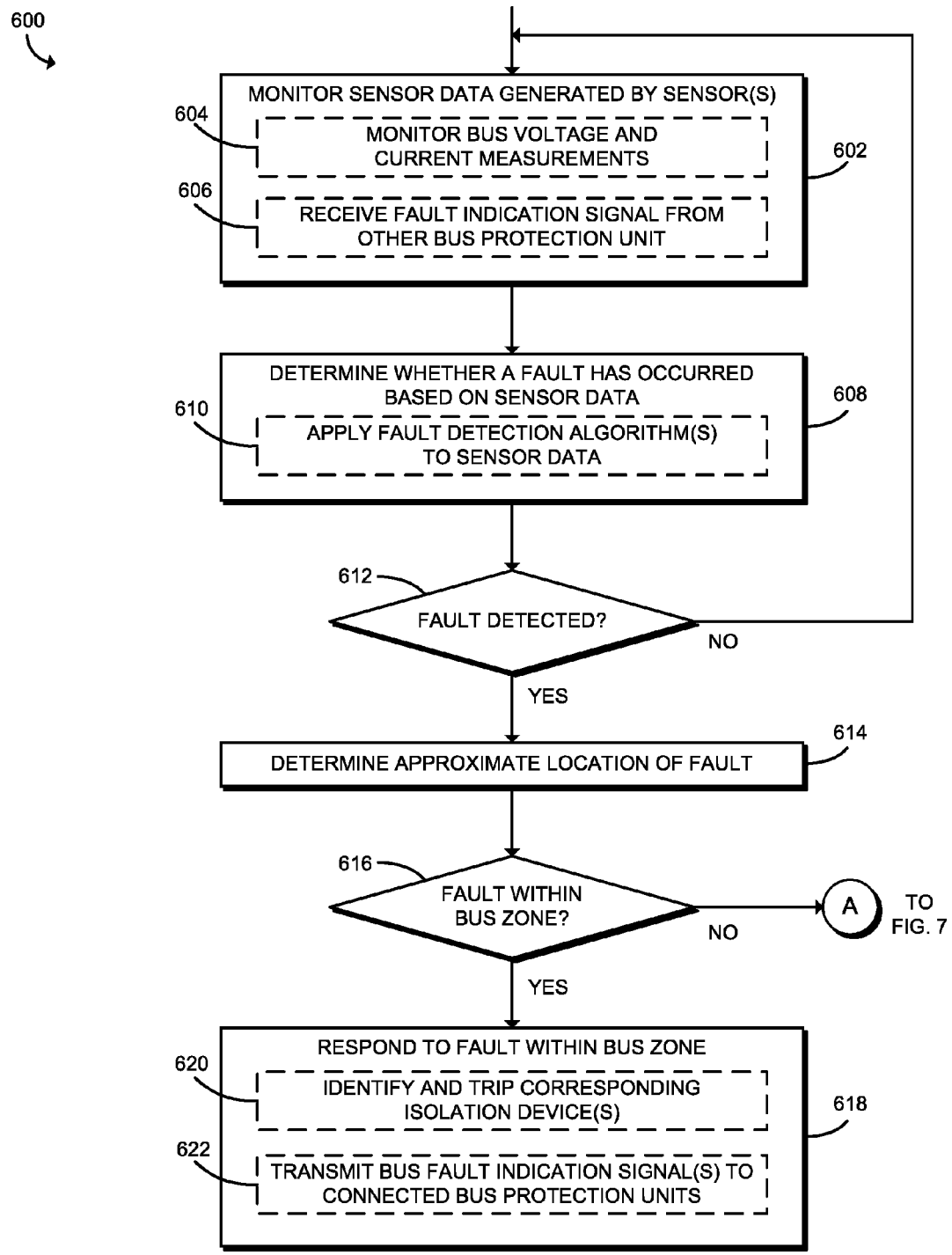
FIGS. 6-7 is a simplified flow diagram of at least one embodiment of a method for detecting a fault location in a DC distribution system.
Figure 7:
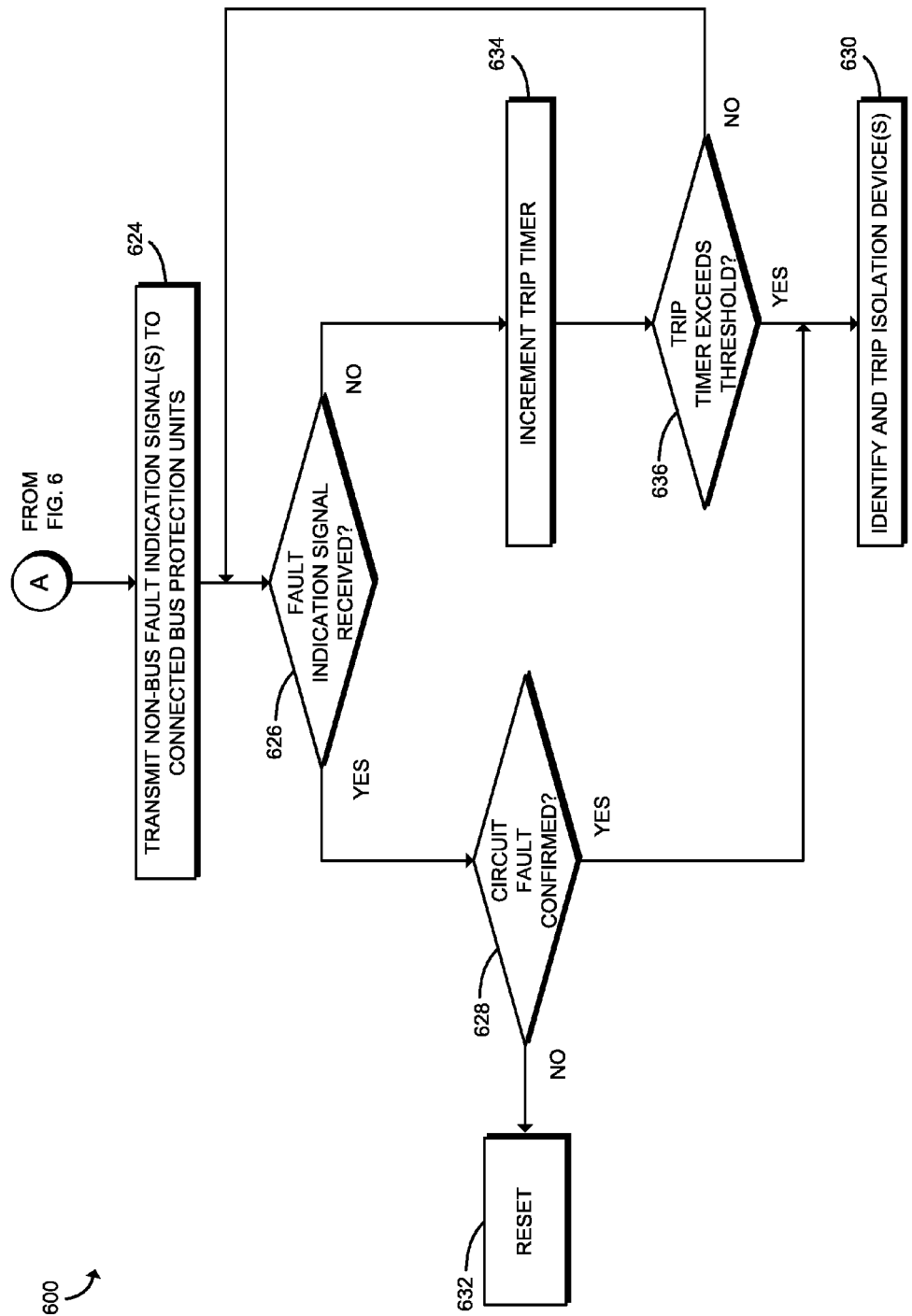

Referring now to FIGS. 6-7, in use, the bus protection unit 400 may execute a method 600 for detecting a fault location in the DC distribution system 100. The illustrative method 600 begins with block 602 in which the bus protection unit 400 monitors the sensor data generated by the sensors 420 coupled to the bus protection unit 400. In particular, in block 604, the bus protection unit 400 may monitor bus voltage and current measurements generated by the sensors 420. As described above, the bus protection unit 400 may monitor the sensor data continuously, periodically, or based on other criteria depending on the particular embodiment. In block 606, the bus protection unit 400 may receive a fault indication signal from another bus protection unit 400 (e.g., a neighboring bus protection unit, either upstream or downstream) indicating that a fault has been detected and/or identified. In some embodiments, the fault indication signal may prompt the bus protection unit 400 to determine whether the fault originates from a distribution circuit monitored by the bus protection unit 400. In other embodiments, the fault indication signal may indicate that a fault has been identified and isolated elsewhere in the DC distribution system 100.

In block 608, the bus protection unit 400 determines whether a fault has occurred based on the sensor data. In doing so, in block 610, the bus protection unit 400 may apply one or more fault detection algorithms to the sensor data. In some embodiments, the bus protection unit 400 may analyze various fault signatures based, for example, on voltage magnitudes, voltage derivatives, current directions, current magnitudes, current derivatives, current differentials, fault impedance, transient power, and/or other suitable parameters. For example, in some embodiments, a significant bus voltage decrease or current increase may indicate the existence of a fault.

If the bus protection unit 400 determines, in block 612, that a fault has been detected, the bus protection unit 400 determines an approximate location of the fault in block 614. For example, in the illustrative embodiment of FIG. 2, the bus protection unit 400 determines whether the fault has occurred within a bus zone monitored by the bus protection unit 400 (e.g., the bus zone defined by the monitored bus 104, 106, 108). It should be appreciated that the bus protection unit 400 may utilize any suitable techniques, mechanisms, and/or algorithms for determining whether the fault occurred within the bus zone. For example, in some embodiments, the bus protection unit 400 may utilize fault signatures such as currents and/or transient energy to discriminate upstream and downstream faults. In particular, in some embodiments, the bus protection unit 400 may identify a particular fault location in a DC distribution system 100 based on the techniques described in one or more of U.S. patent application Ser. No. 14/255,674 and International Patent Application Serial No. PCT/CN2014/076720, which are hereby incorporated by reference. If the bus protection unit 400 determines that no fault has been detected in block 612, the method 600 returns to block 602 in which the bus protection unit 400 continues to monitor the sensor data generated by the sensors 420.

If the bus protection unit 400 determines, in block 616, that the fault occurred within the bus zone, the bus protection unit 400 responds to the fault in block 618. In doing so, in block 620, the bus protection unit 400 identifies and trips the isolation device(s) 112 corresponding with the fault. For example, in some embodiments, the bus protection unit 400 determines which isolation devices 112 should be tripped in order to disconnect the faulted bus. In block 622, the bus protection unit 400 may further transmit a bus fault indication signal indicative of the fault to each of the connected (neighboring) bus protection units. For example, if a main bus protection unit 208 identifies a fault, the main bus protection unit 208 may transmit a bus fault indication signal downstream to the distribution bus protection units 210 communicatively coupled to the main bus protection unit 208 (e.g., if the fault is determined to be downstream of the main bus protection unit 208). If a distribution bus protection unit 210 identifies a fault, the distribution bus protection unit 210 may transmit a bus fault indication signal upstream to the main bus protection unit(s) 208 (e.g., if the fault is determined to be upstream of the distribution bus protection unit 210) and/or downstream to the load bus protection units 212 communicatively coupled to the distribution bus protection unit 210 (e.g., if the fault is determined to be downstream of the distribution bus protection unit 210). As described herein, it should be appreciated that a trip command may be transmitted to the corresponding upstream/downstream isolation devices 112 after the fault has been confirmed by the corresponding upstream/downstream bus protection unit 400. In some embodiments, the bus protection unit 400 only transmits the bus fault indication signals upstream (i.e., toward the power sources 102) or downstream depending, for example, on the determined location of the fault.

If the bus protection unit 400 determines, in block 616, that the fault is not within the bus zone, the method 600 advances to block 624 of FIG. 7 in which the bus protection unit 400 transmits a non-bus fault indication signal indicative of the identified fault to the connected/neighboring bus protection units (e.g., upstream and/or downstream). In block 626, the bus protection unit 400 determines whether a fault indication signal has been received from another bus protection unit. For example, in some embodiments, the bus protection unit 400 may receive a signal that indicates the fault has been identified by another bus protection unit. If a fault indication signal has been received, the bus protection unit 400 determines in block 628 whether the fault can be confirmed as occurring on a directly connected circuit. If so, in block 630, the bus protection unit 400 identifies and trips the appropriate isolation device(s) 112 in order to isolate the faulted circuit as described herein. However, if the bus protection unit 400 cannot confirm the fault as occurring on the directly connected circuit, the bus protection unit 400 performs one or more reset operations in block 632. For example, in some embodiments, the bus protection unit 400 may reset one or more of the isolation devices 112 and/or restart execution of the method 600 (e.g., after a predefined time of delay). In other embodiments, the bus protection unit 400 may any other suitable operation in order to handle the fault occurring on the directly connected circuit.

If the bus protection unit 400 determines in block 626 that no fault indication signal has been received from another bus protection unit, the bus protection unit 400 increments a trip timer in block 634. In block 636, the bus protection unit 400 compares the trip timer to a predetermined threshold value set for the trip timer and determines whether the trip timer exceeds the threshold value. If so, the bus protection unit 400 identifies and trips the appropriate isolation devices 112 in block 630. If not, the method 600 returns to block 626 in which the bus protection unit 400 determines whether a fault indication signal has been received from another bus protection unit 400 (e.g., upstream or downstream). If not, the bus protection unit 400 again increments the trip timer in block 634. For example, in some embodiments, if a fault is determined to be downstream of the bus protection unit 400, a trip command may be sent to the appropriate isolation devices 112 after the trip timer (e.g., a backup timer) exceeds the predetermined threshold value. As such, the trip timer provides a backup protection function for downstream bus protection units.

As shown in FIG. 3, in some embodiments, the bus protection units 208, 210, 212 do not communicate with one another over separate communication links. For example, in compact DC distribution systems 100 such as DC data center power supply systems, the protection zone of a particular bus protection unit 208, 210, 212 may be extended to include the upstream incoming circuit, which creates an overlap between two neighboring zones. It should be appreciated that the bus protection unit 400 may execute a method similar to the method 600 described herein for such embodiments. For example, in some embodiments, the bus protection unit 400 may execute the method 800 of FIG. 8.

Figure 8:
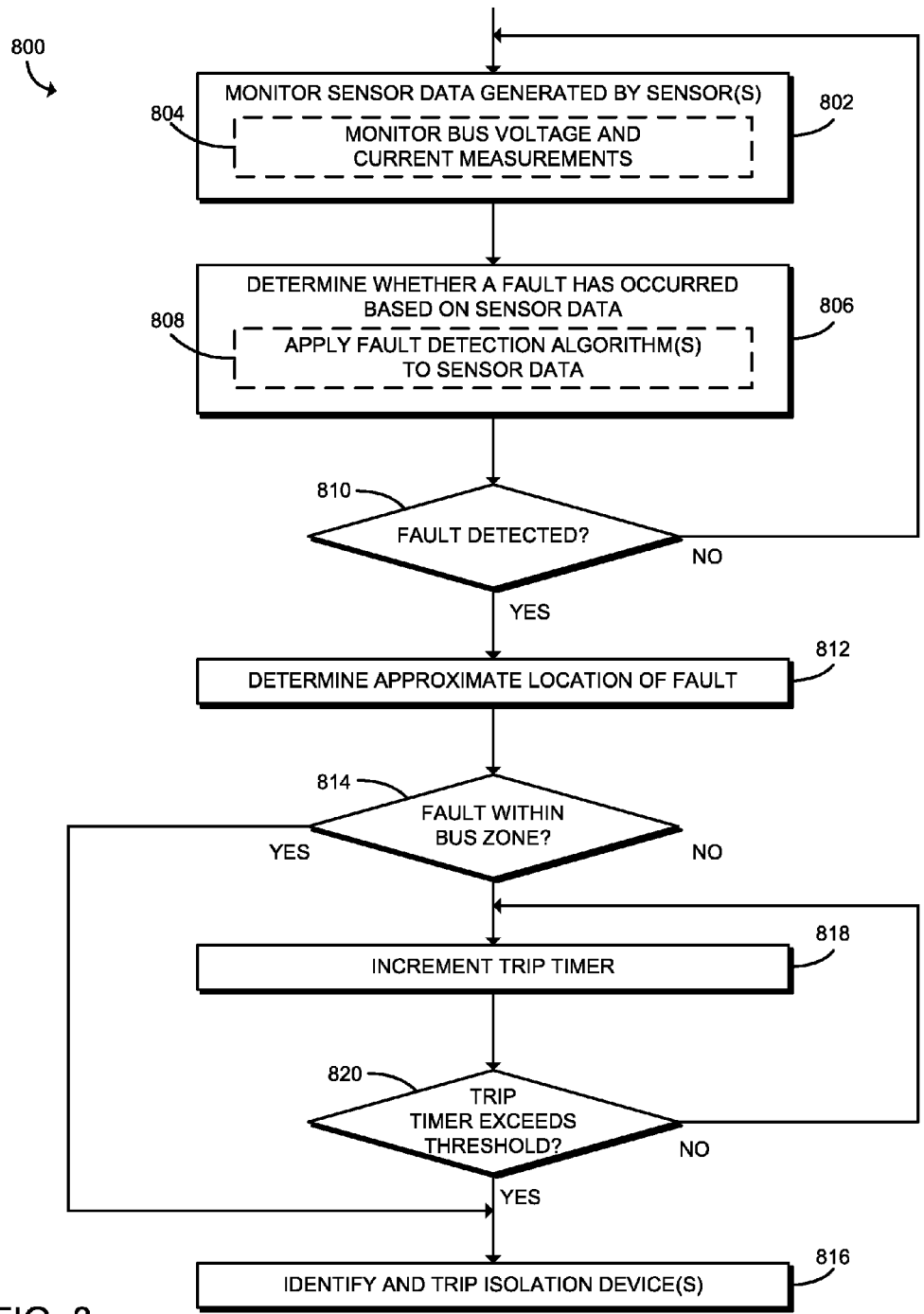
FIG. 8 is a simplified flow diagram of at least one embodiment for detecting a fault location in a DC distribution system without communication.

Referring now to FIG. 8, in use, the bus protection unit 400 may execute a method 800 for detecting a fault location in a DC distribution system 100 that does not include communication (see, for example, the DC distribution system 300 of FIG. 3). The illustrative method 800 begins with block 802 in which the bus protection unit 400 monitors the sensor data produced by the sensors 420 coupled to the bus protection unit 400. In particular, in block 804, the bus protection unit 400 may monitor bus voltage and current measurements produced by the sensors 420. As described above, the bus protection unit 400 may monitor the sensor data continuously, periodically, or based on other criteria depending on the particular embodiment.

In block 806, the bus protection unit 400 determines whether a fault has occurred based on the sensor data. In doing so, in block 808, the bus protection unit 400 may apply one or more fault detection algorithms to the sensor data. In some embodiments, the bus protection unit 400 may analyze various fault signatures based, for example, on voltage magnitudes, voltage derivatives, current directions, current magnitudes, current derivatives, current differentials, fault impedance, transient power, and/or other suitable parameters. For example, in some embodiments, a significant bus voltage decrease or current increase may indicate the existence of a fault as described above.

If the bus protection unit 400 determines, in block 810, that a fault has been detected, the bus protection unit 400 determines an approximate location of the fault in block 812. For example, the bus protection unit 400 may determine whether the fault has occurred within a bus zone monitored by the bus protection unit 400. As indicated above, the bus protection unit 400 may utilize any suitable techniques, mechanisms, and/or algorithms for determining whether the fault occurred within the bus zone. If the bus protection unit determines that no fault has been detected in block 810, the method 800 returns to block 802 in which the bus protection unit 400 continues to monitor the sensor data produced by the sensors 420.

If the bus protection unit 400 determines, in block 814, that the fault occurred within the bus zone, the bus protection unit identifies and trips the isolation device(s) 112 corresponding with the fault in block 816. However, if the bus protection unit 400 determines that the fault is not within the bus zone, the bus protection unit 400 increments a trip timer in block 818. In block 820, the bus protection unit 400 compares the trip timer to a predetermined threshold value set for the trip timer and determines whether the trip timer exceeds the threshold value. If so, the bus protection unit 400 identifies and trips the appropriate isolation device(s) 112 in block 816. Otherwise, the method 800 returns to block 818 in which the bus protection unit 400 continues to increment the trip timer. It should be appreciated that, in some embodiments, the bus protection unit 400 may determine that there is no longer a fault within the DC distribution system 100 (e.g., based on real-time sensor data) in which case, the bus protection unit 400 may pause, reset, or disable the trip timer depending on the particular embodiment.

The invention claimed is:

1. A bus protection unit for detecting a fault location in a direct current (DC) electrical distribution system, the bus protection unit comprising:
at least one sensor configured to produce sensor data indicative of one or more characteristics of a DC electrical bus monitored by the bus protection unit;
a fault detection module configured to (i) monitor the sensor data, (ii) determine whether a fault has occurred based on the produced sensor data, and (iii) determine whether the fault occurred within a bus zone defined by the DC electrical bus in response to a determination that the fault has occurred;
a fault isolation module configured to (i) trip isolation devices within the bus zone in response to a determination that the fault occurred within the bus zone and (ii) to trip isolation devices within the bus zone in response to a communication from another bus protection unit that indicates the fault has occurred within the bus zone; and
a communication module configured to transmit a fault indication signal to a neighboring bus protection unit in response to a determination that the fault has occurred.

2. The bus protection unit of claim 1, wherein to monitor the sensor data comprises to monitor a bus voltage of the DC electrical bus.

3. The bus protection unit of claim 1, wherein to monitor the sensor data comprises to monitor a current of the DC electrical bus.

4. The bus protection unit of claim 1, wherein to determine whether the fault occurred comprises to apply a fault detection algorithm to the produced sensor data.

5. The bus protection unit of claim 1, wherein the isolation device comprises an electrical switch.

6. The bus protection unit of claim 1, wherein the communication module is further configured to transmit the fault indication signal to each other bus protection unit communicatively coupled to the bus protection unit.

7. The bus protection unit of claim 1, wherein to transmit the fault indication signal to the neighboring bus protection unit comprises to transmit a digital signal to the neighboring bus protection unit.

8. The bus protection unit of claim 1, further comprising a fault timer module configured to (i) establish a trip timer in response to transmittal of the fault indication signal to the neighboring bus protection unit and (ii) trip the isolation device in response to a determination that the trip timer has exceeded a predetermined threshold.

9. The bus protection unit of claim 1, wherein the bus protection unit comprises a distribution bus protection unit that monitors a DC distribution bus electrically coupled to a main bus and a load bus.

10. The bus protection unit of claim 9, wherein the distribution bus protection unit is communicatively coupled to a main bus protection unit that monitors the main bus and a load bus protection unit that monitors the load bus.

11. The bus protection unit of claim 1, wherein the bus protection unit comprises a load bus protection unit that monitors a DC load bus electrically coupled to a distribution bus.

12. The bus protection unit of claim 1, wherein the bus protection unit comprises a main bus protection unit that monitors a DC main bus electrically coupled to a utility power system and a distribution bus.

13. The bus protection unit of claim 1, wherein the bus protection unit comprises a microcontroller.

14. A method for detecting a location of a fault in a direct current (DC) electrical distribution system, the method comprising:
monitoring, by a bus protection unit, sensor data produced by at least one sensor of the bus protection unit, wherein the sensor data is indicative of one or more characteristics of a DC electrical bus monitored by the bus protection unit;
determining, by the bus protection unit, whether a fault has occurred based on the produced sensor data;
determining, by the bus protection unit, whether the fault occurred within a bus zone defined by the DC electrical bus in response to determining the fault has occurred;
tripping, by the bus protection unit, isolation devices within the bus zone in response to (i) determining the fault occurred within the bus zone or (ii) receiving a communication from another bus protection unit indicating that the fault has occurred within the bus zone;
transmitting, by the bus protection unit, a bus fault indication signal to a neighboring bus protection unit in response to determining the fault has occurred;
establishing, by the bus protection unit, a trip timer in response to transmitting the fault indication signal to the neighboring bus protection unit; and
tripping, by the bus protection unit, the isolation device in response to determining that the trip timer has exceeded a predetermined threshold.

15. The method of claim 14, wherein monitoring the sensor data comprises monitoring at least one of a bus voltage or a current of the DC electrical bus.

16. The method of claim 14, further comprising transmitting, by the bus protection unit, the fault indication signal to each other bus protection unit communicatively coupled to the bus protection unit.

17. One or more machine-readable storage media comprising a plurality of instructions stored thereon that, in response to execution by a bus protection unit, causes the bus protection unit to:
monitor sensor data produced by at least one sensor of the bus protection unit, wherein the sensor data is indicative of one or more characteristics of a DC electrical bus monitored by the bus protection unit;
determine whether a fault has occurred based on the produced sensor data;
determine whether the fault occurred within a bus zone defined by the DC electrical bus in response to a determination that the fault has occurred;
trip isolation devices within the bus zone in response to at least one of (i) a determination that the fault occurred within the bus zone and (ii) a communication from another bus protection unit that indicates the fault has occurred within the bus zone; and
transmit a bus fault indication signal to a neighboring bus protection unit in response to a determination that the fault has occurred.

18. The one or more machine-readable storage media of claim 17, wherein to monitor the sensor data comprises to monitor at least one of a bus voltage or a current of the DC electrical bus.

19. The one or more machine-readable storage media of claim 17, wherein to transmit the fault indication signal to the neighboring bus protection unit comprises to transmit a digital signal to the neighboring bus protection unit.

20. The one or more machine-readable storage media of claim 17, further comprising instructions to cause the bus protection unit to (i) establish a trip timer in response to transmittal of the fault indication signal to the neighboring bus protection unit and (ii) trip the isolation device in response to a determination that the trip timer has exceeded a predetermined threshold.

* * * * *